United States Patent
Chapman et al.

(10) Patent No.: US 6,594,723 B1
(45) Date of Patent: Jul. 15, 2003

(54) METHOD AND APPARATUS FOR UPDATING DATA IN NONVOLATILE MEMORY

(75) Inventors: Craig Chapman, Redmond, WA (US); Hang Li, Redmond, WA (US); Mark M. Moeller, Bellingham, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/391,134

(22) Filed: Sep. 7, 1999

(51) Int. Cl.[7] .............................................. G06F 12/00
(52) U.S. Cl. ...................... 711/103; 711/154; 712/37; 713/1; 713/2; 713/100
(58) Field of Search .............................. 711/102, 103, 711/154; 712/37; 713/1, 2, 100

(56) References Cited

U.S. PATENT DOCUMENTS

| | | | |
|---|---|---|---|
| 5,101,490 A | | 3/1992 | Getson, Jr. et al. ......... 395/425 |
| 5,579,522 A | * | 11/1996 | Christeson et al. |
| 5,727,170 A | * | 3/1998 | Mitchell et al. |
| 5,835,933 A | | 11/1998 | Wells et al. ................. 711/103 |
| 5,854,937 A | * | 12/1998 | Woodward |
| 5,873,112 A | * | 2/1999 | Norman ....................... 711/103 |
| 6,195,511 B1 | * | 2/2001 | Harada ........................ 396/300 |
| 6,292,868 B1 | * | 9/2001 | Norman ....................... 711/103 |
| 6,327,652 B1 | * | 12/2001 | England et al. ................. 713/2 |
| 2002/0016908 A1 | * | 2/2002 | Tanaka ........................... 713/1 |

* cited by examiner

Primary Examiner—Do Hyun Yoo
Assistant Examiner—Christian P. Chace
(74) Attorney, Agent, or Firm—Lee & Hayes PLLC (57) ABSTRACT

A computer system includes a Flash or other nonvolatile memory. A program(s) to coordinate data transfers is loaded into a volatile system memory to transfer data from an external device to the Flash memory. The data transferred from the external device to the Flash memory can be transferred to a previously unused portion of the Flash memory, or alternatively can overwrite a previously used portion of the Flash memory. According to one aspect of the invention, the data is transferred from the external device to the volatile system memory and then from the volatile system memory to the Flash memory, allowing additional verification steps to help insure that the data is transferred intact. According to another aspect of the invention, data is copied from the external device to the Flash memory on a portion by portion basis, leaving a set of critical portions to be transferred last.

20 Claims, 7 Drawing Sheets

METHOD AND APPARATUS FOR UPDATING DATA IN NONVOLATILE MEMORY

TECHNICAL FIELD

This invention relates to nonvolatile memories, and more particularly to updating data stored in nonvolatile memories.

BACKGROUND

Some modern computer systems use a type of nonvolatile memory device referred to as "Flash memory" or "Flash RAM". Flash memory is a type of electrically erasable programmable read-only memory (EEPROM) that can be erased and reprogrammed in units of memory cells referred to as "blocks". Data can be written into and read from the Flash memory analogous to other types of conventional memories.

Flash memories can be used as a replacement for other types of nonvolatile storage media (e.g., other read only memories (ROMs) or magnetic disks) as well as more traditional types of system memory (e.g., random access memory (RAM)). When using Flash memory, data can be transferred from the Flash memory to a volatile system memory before being accessed by a processor in the system. Alternatively, the data can be accessed directly from the Flash memory. For example, instructions can be "executed in place" from the Flash memory, not requiring the instructions to be transferred to volatile system memory before being executed by the processor.

Typically, however, current Flash memories do not allow instructions to be executed in place while the Flash memory is being written to. This limitation makes it difficult to update instructions in the Flash memory, often requiring the updating to be performed by an individual possessing special knowledge and/or skill rather than by the typical computer user.

This problem can be aggravated if appropriate care is not taken to ensure that the updating of the Flash memory is carried out completely. That is, if the computer is turned off during the updating process, the results can be disastrous. This is particularly true when, for example, an operating system in the Flash memory is being updated. If the computer is turned off while the operating system is being updated, the operating system may not function properly (or at all) when the computer is next restarted.

The invention described below addresses these disadvantages, providing an improved way to update instructions and/or data in Flash memory.

SUMMARY

A computer system includes a Flash or other nonvolatile memory. A program(s) to coordinate data transfers is loaded into a volatile system memory to transfer data from an external device to the Flash memory. The data transferred from the external device to the Flash memory can be transferred to a previously unused portion of the Flash memory, or alternatively can overwrite a previously used portion of the Flash memory.

According to one aspect of the invention, the computer operating system is temporarily re-configured to use only a portion of the volatile system memory. Another portion (a reserved portion) of the system memory is not made available to the operating system and is used to store a temporary operating system and the new data to be copied to the Flash memory. The new data is copied from the external device to the reserved portion and is verified. By copying the new data into the system memory, any errors in copying the data from the external device can be detected before the Flash memory is affected. The data is then copied from the reserved portion to the Flash memory, and again verified.

According to another aspect of the invention, data is copied from the external device to the Flash memory on a portion by portion basis, each portion being made up of one or more bytes of data. The portions are transferred according to an order in which a set of critical portions is transferred last. If the system were to lose power during the updating process, the system can still function so long as the previous versions of the critical portions in the Flash memory have not been overwritten yet. Thus, transferring the set of critical portions last makes the system more tolerant to accidental power losses during the updating process.

BRIEF DESCRIPTION OF THE DRAWINGS

The present invention is illustrated by way of example and not limitation in the figures of the accompanying drawings. The same numbers are used throughout the figures to reference like components and/or features.

DETAILED DESCRIPTION

The invention is described in the general context of computer-executable instructions, such as program modules, being executed by one or more conventional personal computers. Generally, program modules include routines, programs, objects, components, data structures, etc. that perform particular tasks or implement particular abstract data types. Moreover, those skilled in the art will appreciate that the invention may be practiced with other computer system configurations, including hand-held devices, multi-processor systems, microprocessor-based or programmable consumer electronics, network PCs, minicomputers, mainframe computers, and the like. In a distributed computer environment, program modules may be located in both local and remote memory storage devices.

The invention provides a user-friendly way for data stored in Flash or other nonvolatile memory of a computer system to be updated. Any type of data that can be stored in the memory can be updated, such as program instructions and/or program data.

FIGS. 1–5 illustrate an exemplary computer system used in accordance with the invention. FIGS. 1–5 show a computer system 150 at various stages during a process of updating data stored in Flash memory of computer 150.

Figure 1:
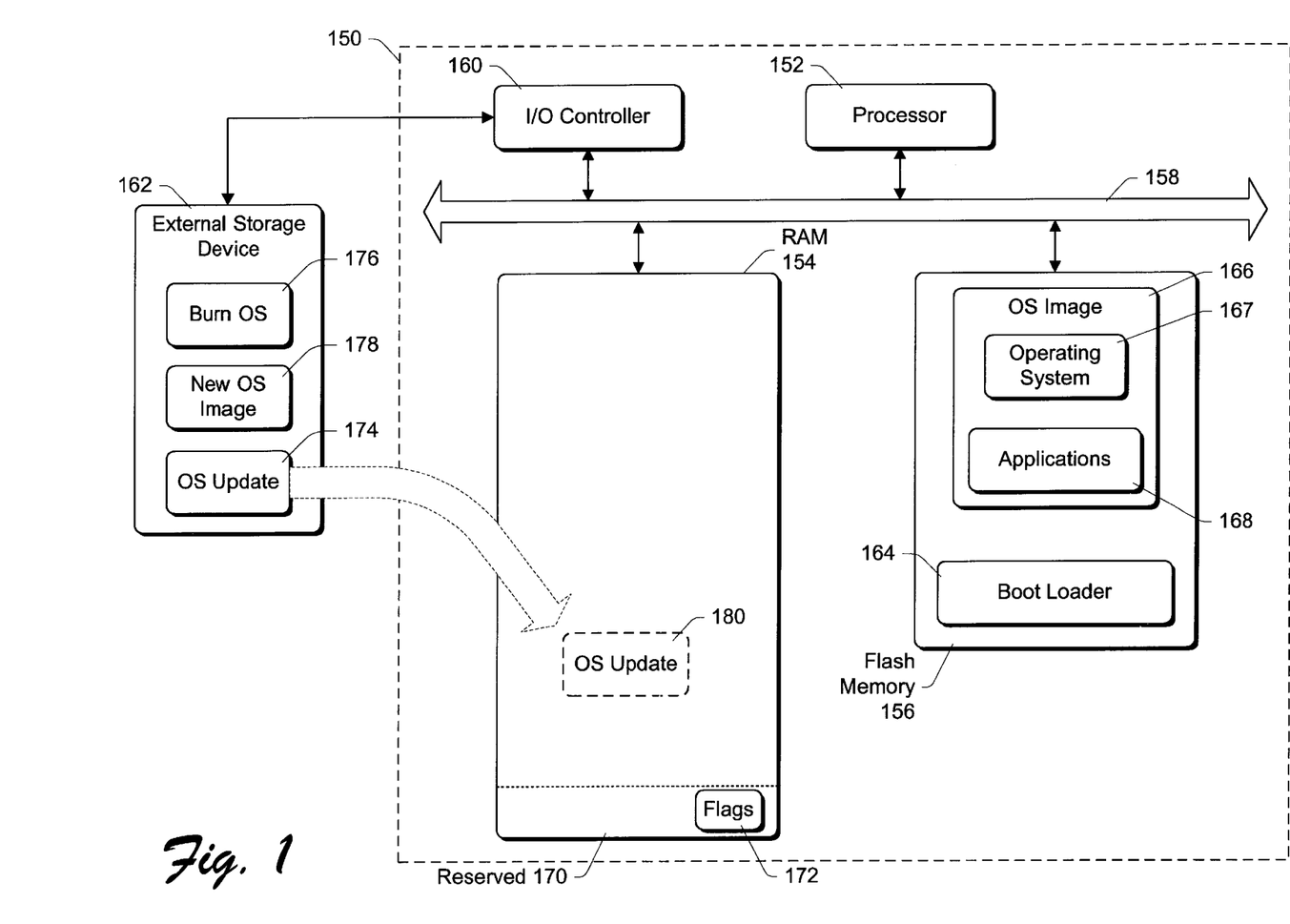
FIGS. 1, 2, 3, 4, and 5 illustrate an exemplary computer system at various stages during a process of updating instructions in a Flash memory in accordance with the invention.

FIG. 1 illustrates computer 150 including a data processor (s) 152, a system memory (RAM) 154, and a Flash memory 156, coupled to a system bus 158. Data processor 152 represents any of a wide variety of conventional processors. Processor 152 executes instructions that are stored in either RAM 154 or Flash memory 156. Additionally, such instructions may exist, at different times, in various cache memories (not shown) of computer 150, such as a cache memory internal to processor 152.

Computer 150 also includes an I/O controller 160 that communicates with an external storage device 162. External storage device 162 represents any of a wide variety of conventional storage devices that can be used to provide data and/or instructions to computer 150. Examples of external storage device 162 include an optical disk (e.g., CD-ROM or DVD), a magnetic disk, a Flash memory device (e.g., a Compact Flash (CF) card), etc. External storage device 162 can be a local device (e.g., a CD-ROM or CF card inserted into computer 150) or alternatively a remote device (e.g., accessed over a network).

System memory 154 is a conventional volatile storage medium, such as dynamic random access memory (DRAM). In the illustrated example, memory 154 comprises 16 Megabytes of memory although larger or smaller amounts of memory can be used. Flash memory 156 is a conventional Flash memory that can be erased and reprogrammed in blocks. In the illustrated example, Flash memory 156 comprises 8 Megabytes of memory although larger or smaller amounts of memory can be used. Alternatively, other types of nonvolatile memory can be used rather than Flash memory. Processor 152 executes instructions stored in Flash memory 156 by loading the instructions directly from Flash memory 156 (referred to as "execute in place"), or alternatively by transferring the instructions to system memory 154 and loading the instructions from system memory 154.

Flash memory 156 includes a boot loader 164 and an operating system image 166 that includes an operating system 167 and one or more applications 168. Boot loader 164 is a set of instructions that are initially executed when the computer 150 is booted. Boot loader 164 causes operating system 167 (or alternatively another application as discussed in more detail below) to execute. Operating system 167 controls execution of other applications and communications with external devices, such as external storage device 162. Operating system 167 can be any of a variety of operating systems, such as any of the "Windows" brand of operating systems (e.g., "Windows CE" operating system) available from Microsoft Corporation of Redmond Washington. Applications 168 can be any of a wide variety of software applications that are intended for long-term storage in computer 150. Examples of such software applications include an audio application to control output of audio data by computer 150 and to receive voice commands, address book and direction applications to provide driving directions to a user of computer 150, etc.

Additionally, in the illustrated embodiment, operating system 167 includes various power management functions that allow the operating system to control the power applied to various components of computer 150. An example of power management functions that can be used are those in the "Advanced Configuration and Power Interface Specification", including both accepted versions of the standard and proposed standards for future adoption. The current version of the Advanced Configuration and Power Interface Specification is Revision 1.0b, Feb. 2, 1999. Information on future versions is available on the Internet at "http://www.teleport.com/~acpi/". When the computer 150 is to be powered down, such as by pressing a power off button on computer 150, different components (such as operating system 167 or a "burn" operating system (discussed in more detail below)) can intercept the power off request and either delay or prevent the full powering off of the computer 150.

System memory 154 includes a reserved portion 170 including multiple flags 172. In the illustrated example, reserved portion 170 comprises a 128 kbyte portion of memory 154 which is typically not available to operating system 166 for storing applications or application data. Various control information can be maintained in the reserved portion 170, such as flags to be used during the update process as discussed in more detail below. Additional applications and application data can be loaded into system memory 154, such as user data or additional user programs.

In the illustrated example, system memory 154 is a volatile memory, so the contents of memory 154 are not maintained when the system is powered down. Alternatively, computer 150 may employ a constant "standby" power state, in which even though the user may believe he or she has powered down the system (e.g., by pressing a power button on computer 150), a small amount of power at 14 least sufficient to maintain the contents of system memory 154 is still provided to computer 150.

To replace instructions in Flash memory 156, the new instructions are provided to computer 150 by external storage device 162. In the discussions to follow, the invention is described in the context of replacing an old version of operating system image 166 (including both the operating system 167 and applications 168) in Flash memory 156 with a new version of the operating system image (including both a new operating system and new applications). However, it is to be appreciated that the invention may be alternatively implemented to replace any program instructions (for example, just operating system 167 or just one of applications 168), program data, etc. in Flash memory 156. The invention may also be used to add new program instructions, program data, etc. to Flash memory 156 without erasing a previously stored version of the program instructions, program data, etc.

External storage device 162 includes an operating system (OS) update program 174, a temporary or "burn" OS 176, and a new OS image 178. OS update program 174 is a software program used to manage the updating of operating system image 166 in Flash memory 156. The burn OS 176 is a temporary operating system that provides a reduced set of functions than that provided by operating system 167. Burn OS 176 is used during parts of the updating process in which the operating system 167 is unable to execute (e.g., because Flash memory 156 is being written to), as discussed in more detail below. The new OS image 178 includes the new version of the operating system that will replace operating system 167 in Flash memory 156.

In the illustrated example, a single OS update program 174, burn OS 176, and new OS image 178 are stored on external storage device 162. Alternatively, multiple such programs may be stored on external storage device 162. These different programs may correspond to different versions of the programs, so that a single external storage device 162 can be used to update multiple different versions of computer 150. For example, different programs written in different languages (e.g., English, French, Japanese, etc.) may be stored on device 162, with the program in the appropriate language (based on the language used by computer 150) being used to update the instructions in the Flash memory 156. In one such alternative implementation, the locations (or file names) of each different version of the programs on device 162 are pre-determined and the location (or file name) of the appropriate version for computer 150 is stored in reserved portion 170. Thus, during the updating process, the location of the correct versions of the programs 174, 176, and 178 can be identified.

When external storage device 162 is coupled to computer system 150, OS update program 174 is copied into system memory 154 as OS update program 180. In the illustrated example, the copying of OS update program 174 is initiated by an "autorun" feature of operating system 166 that automatically copies and runs the OS update program 174. Alternatively, the OS update program 180 could be copied from Flash memory 156 rather than external storage device 162.

The burn OS 176 temporarily disables the power off state in computer system 150. Burn OS 176 intercepts any power off requests, such as resulting from a user activating a "power off" key/button or turning off the ignition of a vehicle that computer 150 is part of, and leave the system powered. By intercepting such power off requests, the system can continue to perform the process of updating the operating system 166 despite the power off request.

The OS update program 180 then sets a "phase 1" flag in flags 172 and reboots the system 150. Rebooting the system 150 terminates execution of any applications being run by processor 152 and causes boot loader 164 to begin execution. This rebooting process, however, does not reset memory 154, so the contents of memory 154 are not lost.

Figure 2:
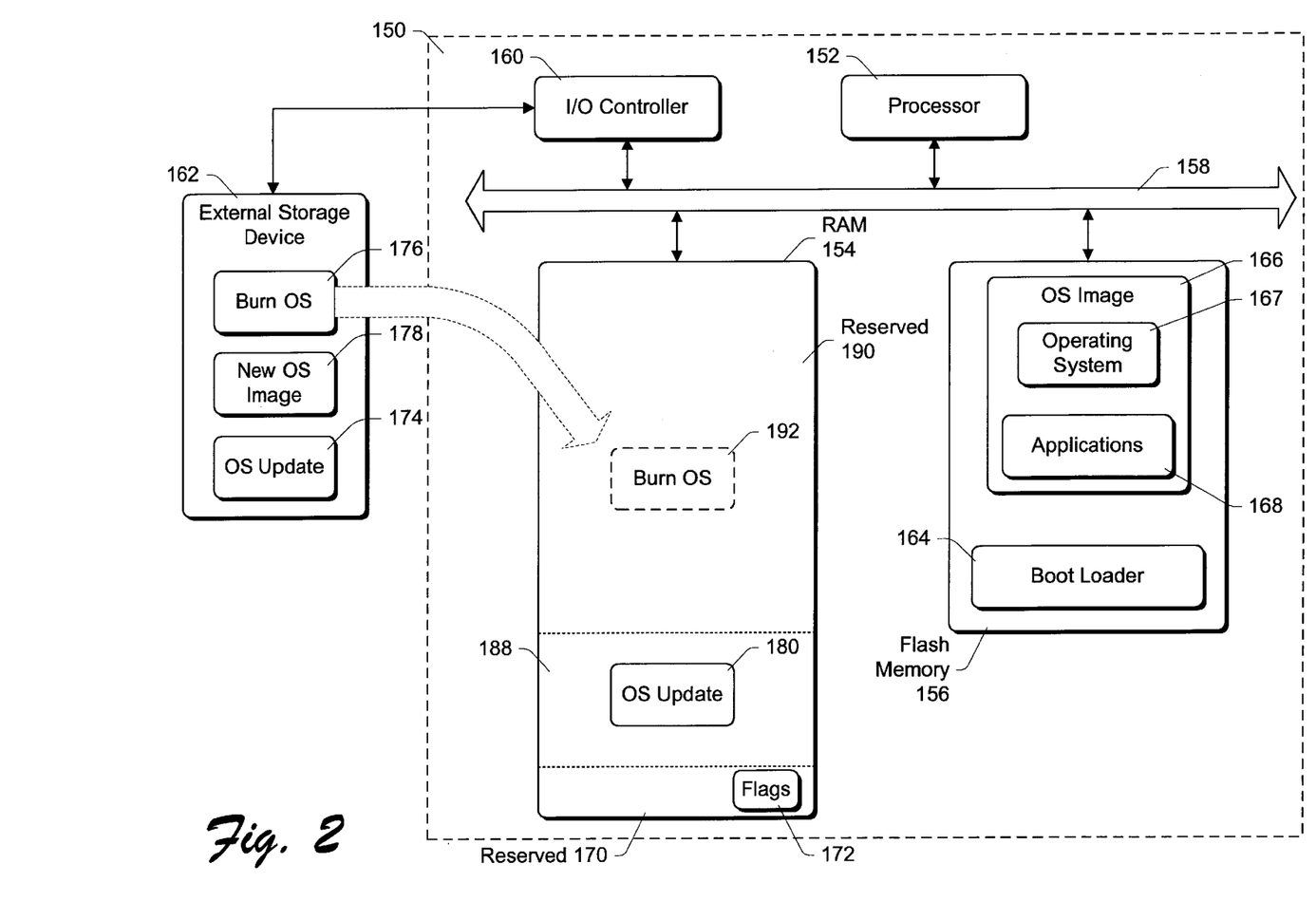

FIG. 2 illustrates computer system 150 after being rebooted. The rebooting of system 150 causes boot loader 164 to execute, which in turn begins execution of operating system 166. However, the phase 1 flag in flags 172 having been set is detected by operating system 167, which limits operating system 167 to only a portion of system memory 154. In the illustrated example, operating system 167 is limited to the lower four Megabytes 188 (except for the 128 kbit reserved portion 170), while the upper twelve Megabytes 190 are reserved.

The operating system 167 executes, using only the portion 188. By limiting the operating system 167 to the portion 188, operating system 167 is prevented from interfering with the burn OS or the new OS to be loaded into reserved portion 190 later. Once executing, operating system 167 again executes OS update program 180. OS update program 180 detects the phase 1 flag in flags 172 having been set and in response copies burn OS 176 from external storage device 162 to reserved portion 190 as burn OS 192.

OS update program 180 then sets a "phase 2" flag in flags 172 and reboots the system 150. As noted above, this rebooting leaves memory 154 intact.

Figure 3:
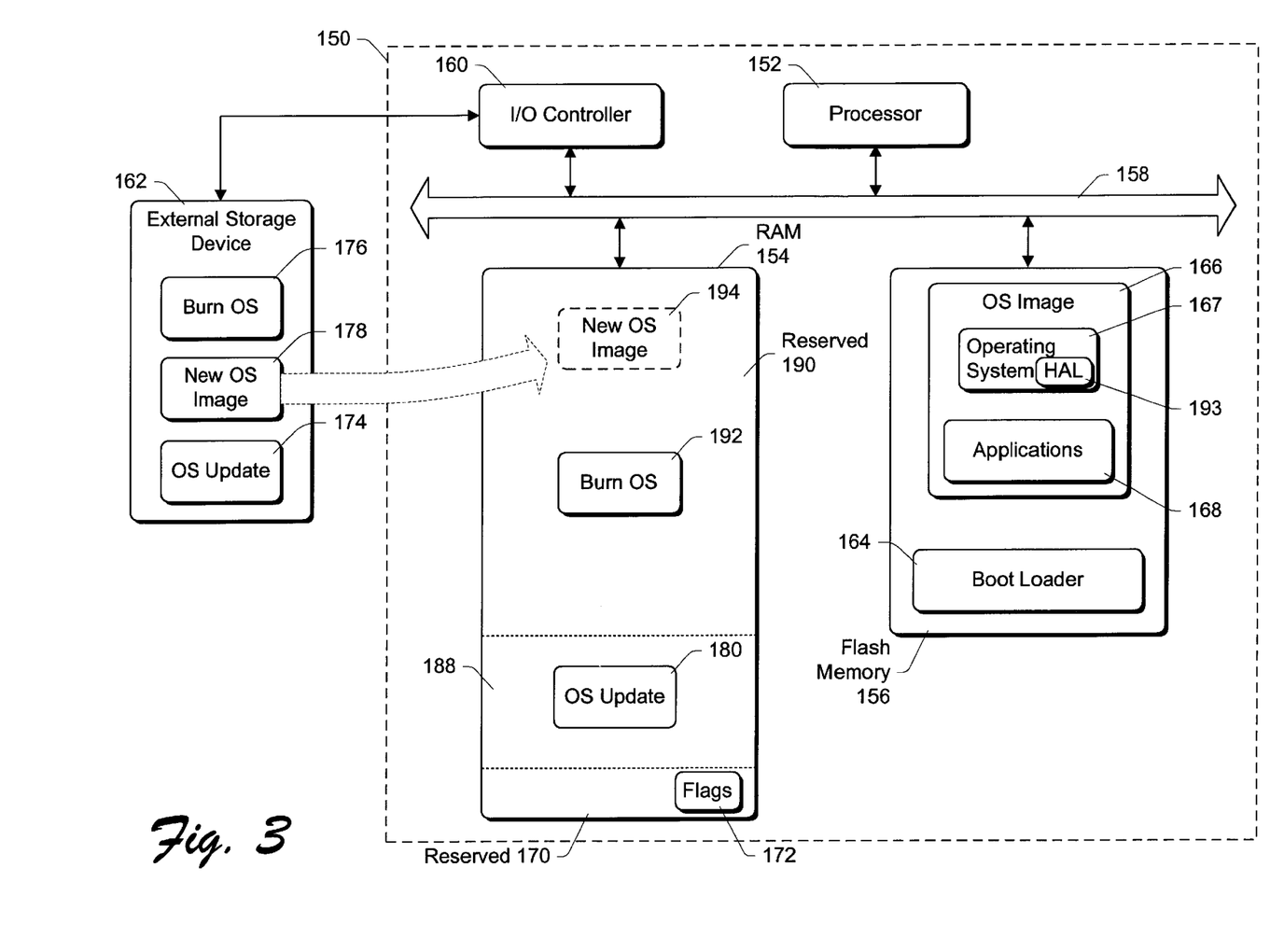

FIG. 3 illustrates computer system 150 after being rebooted. The rebooting of system 150 causes boot loader 164 to execute, which in turn begins execution of operating system 167. However, the hardware abstraction layer (HAL) 193 in operating system 167 detects the phase 2 flag having been set in flags 172 and jumps to execute burn OS 192 rather than continuing execution of operating system 167. Burn OS 192 is a temporary operating system that provides a limited set of typical operating system functionality. These functions include the ability to access external devices (such as an external storage device) and power management functions. The power management functions are analogous to those of operating system 167, thereby allowing burn OS 192 to continue to intercept any power off requests as discussed above.

Burn OS 192 executes OS update program 180, which in turn detects the phase 2 flag in flags 172 having been set. In response, OS update program 180 copies new OS image 178 from external storage device 162 into reserved portion 190 as new OS image 194. OS update program 180 also uses various processes to verify that the new OS image 194 is intact, with no errors having occurred in the process of reading the new OS image 178 from external storage device 162 or writing the new OS image 194 into system memory 154. This verification process includes comparing each byte in new OS image 194 to each byte in new OS image 178 to ensure that the two match. Various additional conventional error-checking protocols can also be employed, such as the use of a checksum.

If the verification process fails, then the updating process fails. Alternatively, if the verification process fails, additional attempts may be made to copy new OS image 178 from external storage device 162.

It is noted that OS update program 180 could copy the new OS image 194 to Flash memory 156 directly without temporarily storing the new OS image in system memory 154. However, this prevents the additional verification process discussed above, resulting in OS update program 180 not being certain that all data can be read from external storage device 162 before it begins erasing Flash memory 156.

Figure 4:
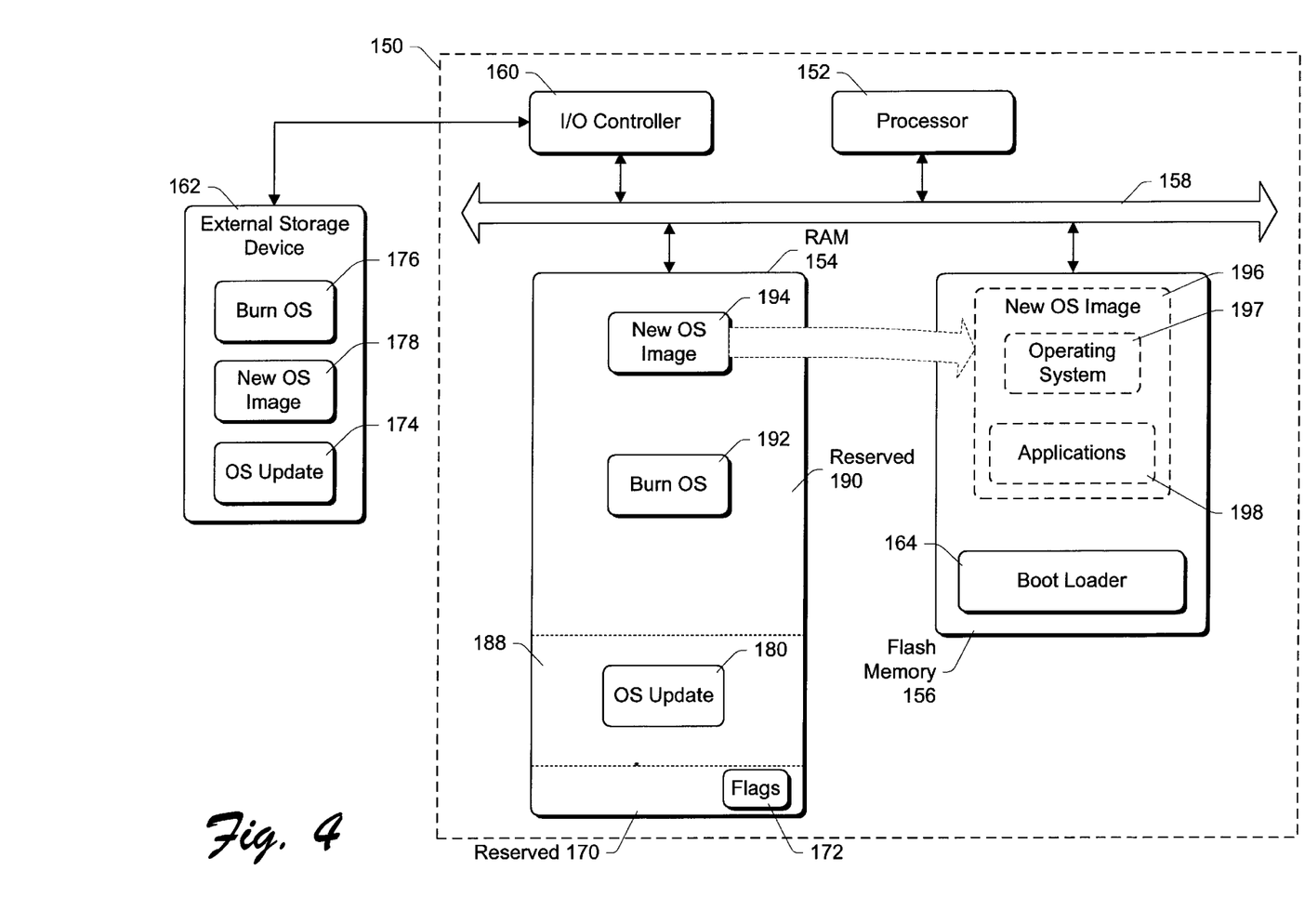

FIG. 4 illustrates computer system 150 after new OS image 194 has been loaded into reserved portion 190 of system memory 154 and has been verified. OS update program 180 sets a phase 3 flag in flags 172 to indicate that the Flash memory 156 is in the process of being updated. The phase 3 flag is used as a safety precaution to protect against the accidental rebooting of system 150 during the process of copying the new OS image 194 into Flash memory 156. If the system 150 is accidentally rebooted, the HAL 193 of the operating system 167 (FIG. 3) detects that the phase 3 flag has been set and in response jumps to execute burn OS 192 rather than continuing execution of operating system 167. Burn OS 192 detects that the phase 3 flag has been set, so it begins execution of OS update program 180 to erase and write new OS image 194 to Flash memory 156. In the illustrated example, OS update program 180 does not attempt to determine how much of the new OS image 194 had been copied before the rebooting occurred. OS update program 180 simply proceeds as if none of new OS 194 had been copied. Alternatively, OS update program 180 may maintain a record (e.g., in reserved portion 170) of its status during the update process and simply pick up where it was interrupted.

OS update program 180 erases the old version of the operating system image in Flash memory 156 (operating system image 166 in FIG. 3). The new version of the operating system image (new OS image 194) is then written or "burned" into Flash memory 156 as new operating system image 196, including both new operating system 197 and new applications 198. Once written, the new operating system image 196 is compared to new OS image 194 in system memory 154 to ensure that the writing process did not produce any errors. Additional conventional error-checking protocols can also be employed to verify the proper writing of the new operating system image 196.

In one implementation, the copying of new OS image 194 from system memory 154 to Flash memory 156 is performed in groups of bytes referred to as "portions". A particular set of portions are pre-determined to be "critical" portions and are pre-programmed into OS update program 180. OS update program 180 erases portions of Flash memory 156 and copies the portions of new OS image 194 to Flash memory 156 on a portion-by-portion basis, leaving this set of critical portions to be erased and copied last. Which portions of the new OS image 194 are the critical portions are dependent on the characteristics of OS image 194. In the illustrated example, the HAL and a symbol table of the operating system are both part of the set of critical portions.

Thus, the critical portions of the previous data (operating system image 166 of FIG. 3) are not erased until the end of the updating process. If power to computer system 150 is lost or turned off during the updating process prior to erasing these critical portions, the operating system 167 can still execute enough instructions using the HAL and the symbol table to begin executing the burn OS 192. The burn OS 192 can then execute OS update program 180 to copy the new OS image 194 into Flash memory 156.

Once the new operating system image 196 has been verified, OS update program 180 clears the phase 1, phase 2, and phase 3 flags in flags 172. Additionally, after operating system image 196 has been verified, burn OS 176 ceases intercepting power-off requests. Alternatively, burn OS 176 may not cease intercepting power-off requests, but once the computer is rebooted with the new operating system 197 (discussed in more detail below), burn OS 176 is no longer running and thus cannot intercept power off requests.

Figure 5:
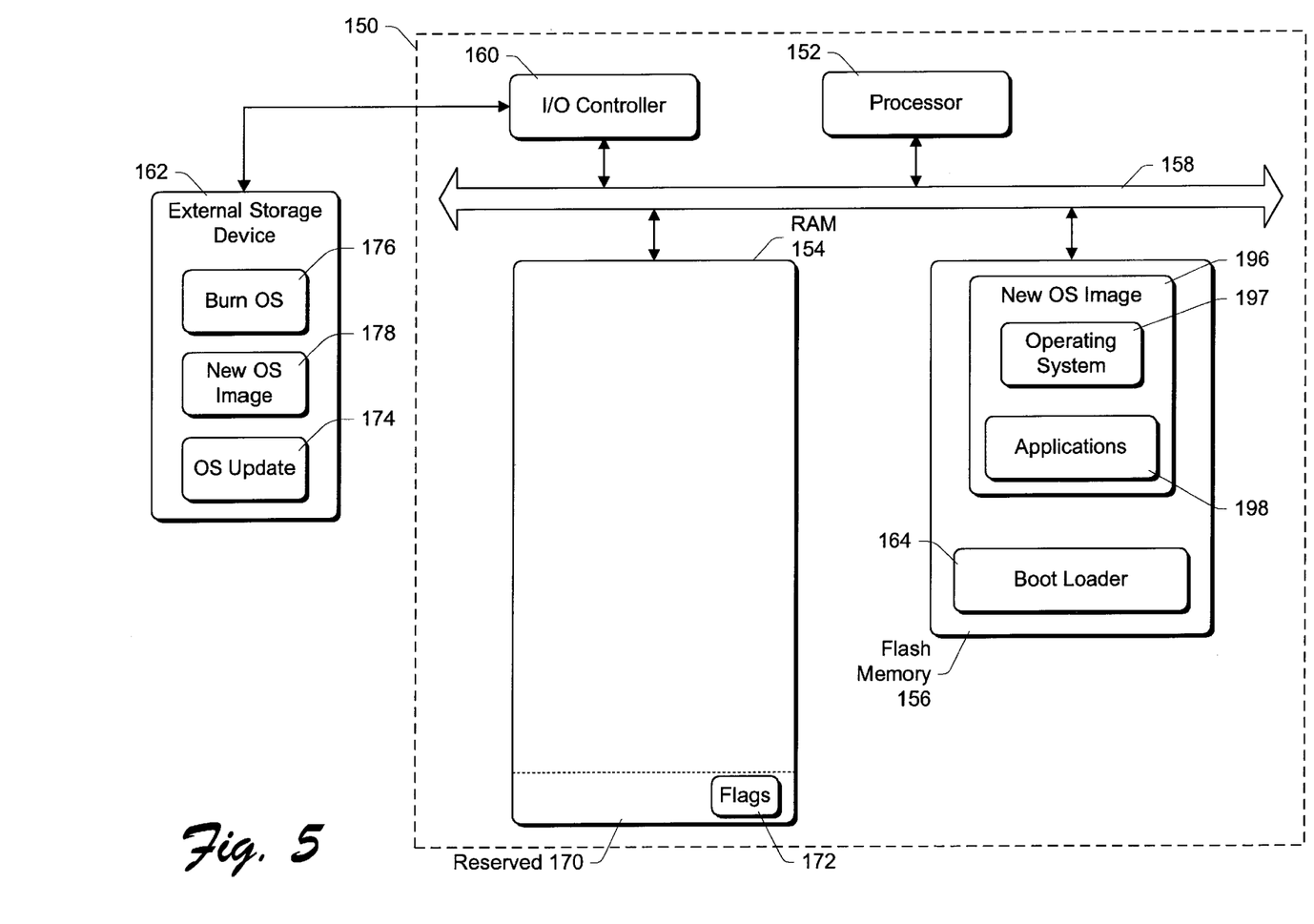

FIG. 5 illustrates computer 150 after being rebooted with new operating system 197. As illustrated, new operating system 197 is loaded into computer 150 and the system memory 154 occupied by OS update program 180, burn OS 192, and new OS image 194 has been reclaimed.

Upon rebooting, boot loader 164 begins execution and starts executing new operating system 197. As the flags 172 have been cleared, new operating system 197 is given access to the entire sixteen Megabytes of memory 154 (except for the 128 kbyte reserved portion 170). New operating system 197 detects that the phase 1, phase 2, and phase 3 flags in flags 172 are not set, and reclaims the system memory 154 occupied by OS update program 180, burn OS 192, and new OS image 194.

Figure 6:
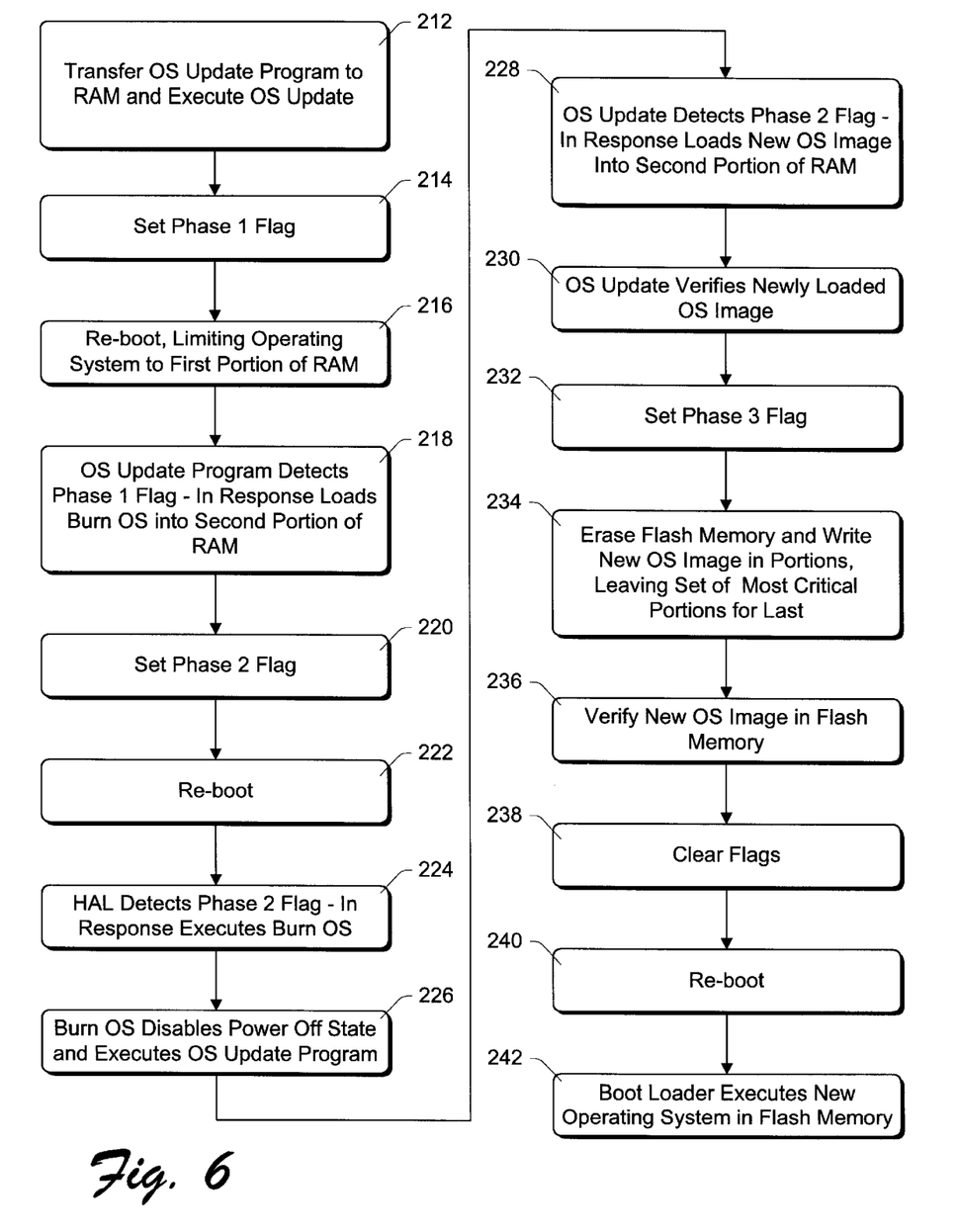
FIG. 6 is a flowchart illustrating an exemplary process for updating a set of instructions in Flash memory according to an embodiment of the invention.

FIG. 6 is a flowchart illustrating an exemplary process for updating a set of instructions in Flash memory according to an embodiment of the invention. In the illustrated examples, the steps of FIG. 6 are implemented in software.

Initially, the OS update program is transferred to system memory (RAM) and executed (step 212). The OS update program sets a phase 1 flag (step 214), and then the computer is rebooted with the operating system being limited to accessing only a first portion of the RAM (step 216).

After rebooting, the OS update program resumes execution and detects the phase 1 flag as having been set, in response to which the OS update program loads a burn OS into a second portion of the RAM (step 218). This second portion of RAM is reserved and is not generally accessible to the operating system. The OS update program then sets a phase 2 flag (step 220) and the system is again rebooted (step 222).

During the reboot operation, the HAL of the operating system detects that the phase 2 flag has been set and in response jumps to execute the burn OS in the second portion of RAM (step 224). The burn OS disables the power-off state and then executes the OS update program (step 226). The OS update program detects that the phase 2 flag has been set and in response loads the new operating system image into the second portion of RAM (step 228). The OS update program verifies the newly loaded OS image (step 230) and then sets a phase 3 flag (step 232).

The OS update program then erases the Flash memory and writes the new OS image to the Flash memory on a portion-by-portion basis, leaving a set of most critical portions for last (step 234). Once completed, the OS update program verifies the new OS image in the Flash memory (step 236). The OS update program then clears the phase 1, phase 2, and phase 3 flags (step 238).

The system is then rebooted (step 240). Upon rebooting, the boot loader executes the new operating system from the Flash memory (step 242), which effectively re-enables the power off state.

Figure 7:
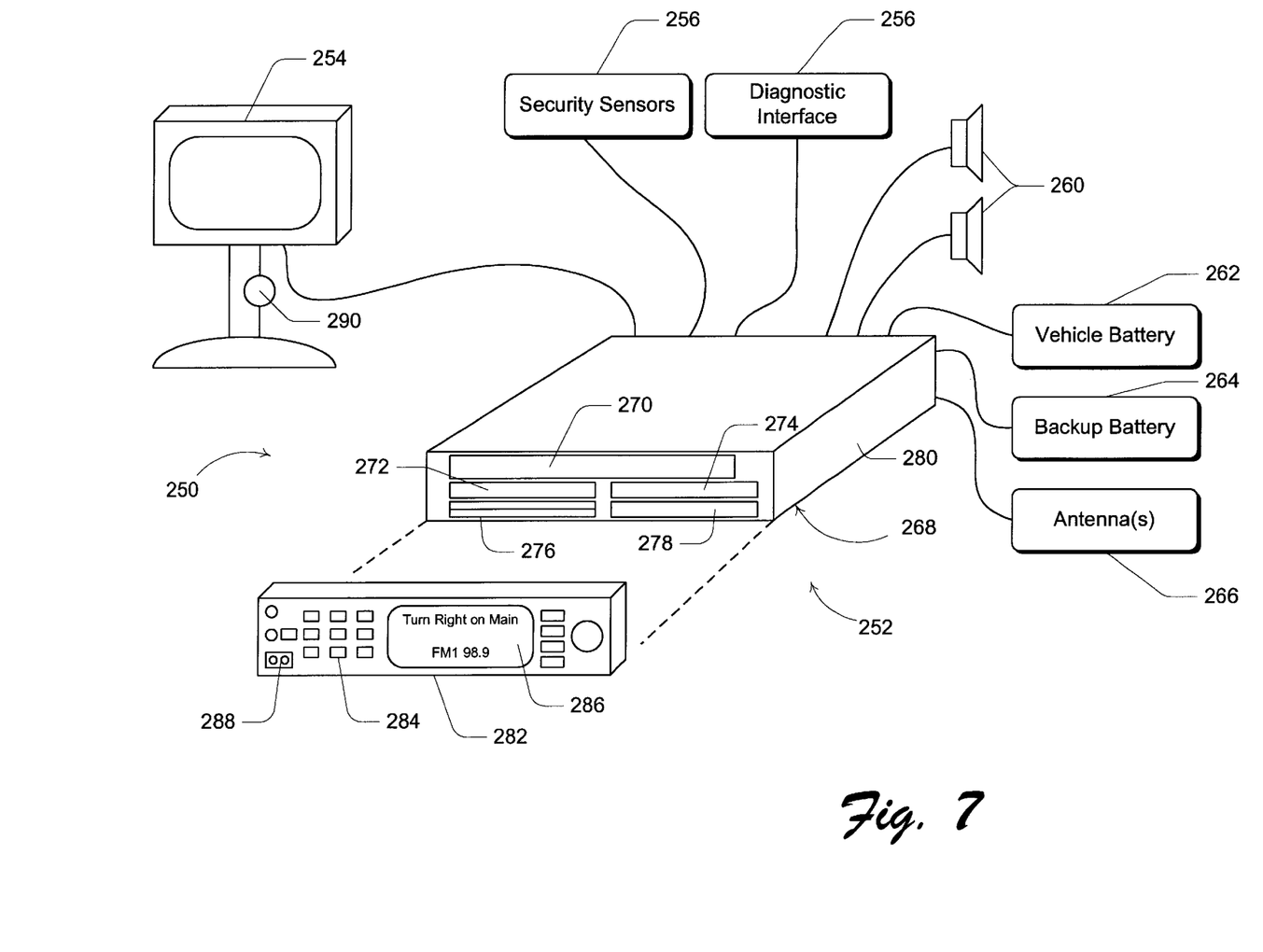
FIG. 7 shows an exemplary vehicle computer system such as may be used with the invention.

FIG. 7 shows an exemplary vehicle computer system such as may be used with the invention. FIG. 7 shows a vehicle computer system 250, which, can be computer 150 of FIGS. 1–5. Vehicle computer system 250 has a centralized computer 252 having an internal processor (not shown in FIG. 7), volatile system memory (not shown in FIG. 7), and Flash memory (not shown in FIG. 7). Computer 252 is coupled to various external peripheral devices, including a monitor 254, security sensors 256, a vehicle diagnostic interface 258, speakers 260, a vehicle battery 262, a backup battery 264, and antenna(s) 266. Computer 252 is assembled in a housing 268 that is sized to be mounted in a vehicle dashboard, similar to a conventional automobile stereo.

Computer 252 runs an open platform operating system which supports multiple applications. Using an open platform operating system and an open computer system architecture, various software applications and hardware peripherals can be produced by independent vendors and subsequently installed by the vehicle user after purchase of the vehicle. This is advantageous in that the software applications do not need to be specially configured for uniquely designed embedded systems. In the illustrated example the open hardware architecture runs a multitasking operating system that employs a graphical user interface. A multitasking operating system allows simultaneous execution of multiple applications. One such operating system is the "Windows" brand operating system sold by Microsoft Corporation of Redmond, Wash.

Computer 252 includes at least one storage drive which permits the vehicle user to download programs and data from a storage medium. In the illustrated implementation, computer 252 has a CD ROM drive 270 which reads application-related CDs, as well as musical, video, game, or other types of entertainment CDs. In this manner, CD ROM drive 270 performs a dual role of storage drive and entertainment player. Computer 252 may also optionally include a 3.5" floppy diskette drive 272, a smart card reader 274, dual PCMCIA card sockets 276 which accept PCMCIA card types I, II and III, and a Compact Flash card (CF card) reader 278. Also, a hard disk drive (not shown) may optionally be included on computer 252 for storing application programs and/or user data. A DVD ("digital video disk" or "digital versatile disk") player may also be included in computer 252.

The storage drives are mounted in a base unit 280 of housing 268. Base unit 280 is constructed and sized to be mounted in the dashboard. Optionally, this base unit may be removable in the same fashion as a laptop computer and its associated docking station. This option allows the user to take the vehicle computer to his/her home or office to serve as his/her portable PC. Housing 268 also has a detachable faceplate 282 which is pivotally mounted to the front of base unit 280. The faceplate can be rotated to permit easy and convenient access to the storage drives.

Computer 252 has a keypad 284 (including a power off key) and a display 286 on faceplate 282. The operating system executing on computer 252 controls the faceplate peripheral, which through the faceplate processor, can control faceplate keys 284 and faceplate display 286 as peripheral devices when the faceplate is attached to the base unit. Additionally, computer 252 has a voice recognition device to permit the user to verbally enter commands in a hands-free, eyes-free environment. These voice commands can be used for controlling most operating modes of the vehicle computing platform. Computer 252 is also equipped with an IrDA (infrared developers association) transceiver port 288 mounted on faceplate 282 to transmit and receive data and programs using infrared signals. The entire faceplate unit 282 behaves as a multifunction peripheral to the computing platform.

Computer 252 can output visual data to LCD 286 at the faceplate, or to monitor 254. Display 286 is preferably a back lit LCD. In one implementation monitor 254 is a small flat panel display (e.g., 6.4" screen) that is movably mounted on a stand or yoke and remotely located from the computer. Monitor 254 is fully adjustable to different viewing positions that can be seen by the driver or other passengers in the vehicle. The type of data displayed on the monitor can range widely from word instructions concerning the vehicle's performance, to diagrammatic directions used by the navigation system, to video movies for in-car entertainment. Monitor 254 is equipped with an automatic override switch 290 which automatically disables the display of any non-driving related data when positioned to be viewed by the driver. When facing the driver, only information supportive and helpful to driving (e.g., diagnostics, navigation directions) is displayed on the monitor, while distracting information (e.g., video movies, games) is blocked from display. In one implementation, the switch is an electrical cylindrical switch which closes when the display is capable of being viewed by the driver; thus, the software can sense the display position and only allow permitted information to be displayed.

In general, vehicle computer system 250 can be used to integrate multiple vehicle-related systems onto one open platform hardware and software architecture. For instance, vehicle computer system 250 can serve as a multimedia entertainment system, a navigation system, a communications system, a security system, and a diagnostics system. Moreover, vehicle computer system 250 provides additional functionality traditionally associated with desk-top and lap-top personal computers. For instance, vehicle computer system 250 can support word processing applications, spreadsheet applications, database applications, and appointment/schedule applications. Furthermore, vehicle computer system 250 can be configured to operate as a server to other computing units in the vehicle to distribute games, video movies, and the like to passengers.

To load a new application or data into the system memory of computer 252, the vehicle user inserts a CD or other media into the appropriate drive and the operating system downloads the application or data therefrom. The installation process can be automatically handled by the operating system, or with the assistance of commands input from the user in the form of keyed sequences on keypad 284 or verbal instructions using the voice recognition device. Another technique to load data or applications or transfer data with other computing devices is through the use of IrDA transceiver port 288, or a wireless Internet link.

To add or update an application or data in the Flash memory of computer 252, the vehicle user inserts a CD or other media into the appropriate drive. The application or data is then copied to system memory of computer 252, and subsequently to the Flash memory, as described above.

CONCLUSION

The invention provides for updating data in a Flash or other nonvolatile memory of a computer system. An update program and temporary operating system are loaded into the computer's system memory and operate to copy the new instructions from an external device to the system memory. The new instructions are then copied from the system memory into the Flash memory, advantageously allowing the update program to verify that all the instructions are correctly copied from the external device before replacing any instructions in the Flash memory. Additionally, the instructions are copied from the system memory into the Flash memory leaving a set of critical instructions to be copied last, thereby advantageously overwriting the corresponding critical instructions in the operating system last.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A method comprising:
   identifying a plurality of portions of a set of instructions to be transferred to a nonvolatile memory;
   identifying a subset of the plurality of portions that represent a critical set of instructions;
   transferring all of the plurality of portions other than the subset to the nonvolatile memory; and
   transferring the subset of the plurality of portions to the nonvolatile memory after all other portions have been transferred.

2. A method as recited in claim 1, wherein the nonvolatile memory comprises Flash memory.

3. A method as recited in claim 1, wherein the identifying the plurality of portions comprises identifying the plurality of portions of a set of instructions located in random access memory.

4. A method as recited in claim 1, wherein the identifying the plurality of portions comprises identifying the plurality of portions of a set of instructions located on an external storage device.

5. A method as recited in claim 1, wherein the transferring all of the plurality of portions other than the subset and the transferring the subset of the plurality of portions to the nonvolatile memory comprise, on a portion by portion basis, erasing a plurality of cells of the nonvolatile memory where a portion is to be written and writing the portion to the plurality of cells.

6. A method as recited in claim 1, further comprising disabling a power off state until all of the plurality of portions have been transferred to the nonvolatile memory.

7. At least one computer-readable memory containing a computer program that is executable by a processor to perform the method recited in claim 1.

8. An automobile computer programmed to perform the method as recited in claim 1.

9. A method in a system including volatile system memory and Flash memory, the method comprising:
   executing, under control of an operating system, a Flash memory update program;
   setting a first flag;
   rebooting the system a first time;
   limiting, after rebooting the system the first time, the operating system to accessing a first portion of the system memory;
   detecting, after rebooting the system the first time, the first flag having been set;
   loading a temporary operating system into the first portion of the system memory in response to the first flag having been set;

setting a second flag;

rebooting the system a second time;

detecting, after rebooting the system the second time, the second flag having been set;

executing the temporary operating system in response to the second flag having been set;

loading a new operating system image, including a new operating system, into a second portion of the system memory in response to the second flag having been set, the second portion being different than the first portion of the system memory;

verifying the new operating system image in the second portion of the system memory;

erasing the Flash memory and copying the new operating system image from the second portion of the system memory to the erased Flash memory in portions, including erasing and copying a set of most critical portions for last;

verifying the new operating system image in the Flash memory;

clearing the first and second flags; and rebooting the system a third time.

10. A method as recited in claim 9, further comprising setting a third flag prior to the erasing and copying, the third flag indicating that the method is in the process of copying the new operating system image from the second portion of the system memory to the Flash memory.

11. A method as recited in claim 10, further comprising:

detecting, based on the third flag having been set, whether the system has been rebooted during the erasing and copying; and restarting the erasing and copying in the event the system has been rebooted during the erasing and copying.

12. At least one computer-readable memory containing a computer program that is executable by a processor to perform the method recited in claim 9.

13. An automobile computer programmed to perform the method as recited in claim 9.

14. A computer-readable storage medium having stored thereon computer-executable instructions that cause one or more processors to:

identify a plurality of portions of a set of instructions to be transferred to a nonvolatile memory;

identify a subset of the plurality of portions that represent a critical set of instructions;

transfer all of the plurality of portions other than the subset to the nonvolatile memory; and transfer the subset of the plurality of portions to the nonvolatile memory after all other portions have been transferred.

15. A computer-readable storage medium as recited in claim 14, wherein the nonvolatile memory comprises Flash memory.

16. A computer-readable storage medium as recited in claim 14, wherein the computer-executable instructions that cause the one or more processors to identify the plurality of portions comprise computer-executable instructions that cause the one or more processors to identify the plurality of portions of a set of instructions located in random access memory.

17. A computer-readable storage medium as recited in claim 14, wherein the computer-executable instructions that cause the one or more processors to identify the plurality of portions comprise computer-executable instructions that cause the one or more processors to identify the plurality of portions of a set of instructions located on an external storage device.

18. A computer-readable storage medium as recited in claim 14, wherein the computer-executable instructions that cause the one or more processors to transfer all of the plurality of portions other than the subset and transfer the subset of the plurality of portions to the nonvolatile memory comprise computer-executable instructions that cause the one or more processors to, on a portion by portion basis, erase a plurality of cells of the nonvolatile memory where a portion is to be written and write the portion to the plurality of cells.

19. A computer-readable storage medium as recited in claim 14, wherein the computer-executable instructions further cause the one or more processors to disable a power off state until all of the plurality of portions have been transferred to the nonvolatile memory.

20. A computer-readable storage medium as recited in claim 14, wherein the one or more processors comprise one or more processors of an automobile computer.

* * * * *

UNITED STATES PATENT AND TRADEMARK OFFICE
CERTIFICATE OF CORRECTION

PATENT NO. : 6,594,723 B1
DATED : July 15, 2003
INVENTOR(S) : Chapman et al.

It is certified that error appears in the above-identified patent and that said Letters Patent is hereby corrected as shown below:

Column 4,
Line 13, delete "14" between "at" and "least".

Column 7,
Lines 29, 51 and 52, replace "bum" with -- burn --.

Signed and Sealed this

Eleventh Day of November, 2003

JAMES E. ROGAN
*Director of the United States Patent and Trademark Office*